June 15, 1954 M. W. P. STRANDBERG 2,681,414

AUTOMATIC FREQUENCY CONTROL CIRCUIT

Filed Feb. 1, 1946

INVENTOR.
MALCOM W. P. STRANDBERG
BY
M. C. Hayes
ATTORNEY

Patented June 15, 1954

2,681,414

UNITED STATES PATENT OFFICE 2,681,414

AUTOMATIC FREQUENCY CONTROL CIRCUIT

Malcom W. P. Strandberg, Tacoma, Wash., assignor, by mesne assignments, to the United States of America as represented by the Secretary of the Navy Application February 1, 1946, Serial No. 644,977

3 Claims. (Cl. 250—36)

This invention relates to receiver circuits and more particularly to automatic tuning control circuits for receivers.

Heretofore automatic tuning control circuits employed various complex combinations of detectors, discriminators, resonant circuits, amplifiers, sawtooth generators, etc. to obtain a desired frequency from a local oscillator. The present invention contemplates and has as a primary object the provision of a simplified, novel automatic tuning control circuit.

With this object in view part of the output of a local oscillator is passed through a frequency selective device and the output therefrom is detected and amplified. This amplified output is used to trigger a multivibrator or other suitable switching circuit which in turn triggers, through a unidirectional coupling device, a second multivibrator or other suitable switching circuit on every other cycle. The output from the second multivibrator provides voltages for controlling the frequency of the above local oscillator such as to maintain the frequency near the peak of the resonance curve of the above frequency selective device.

The above and other objects will be apparent from the following specification when taken with the accompanying drawing in which.

Figure 1:
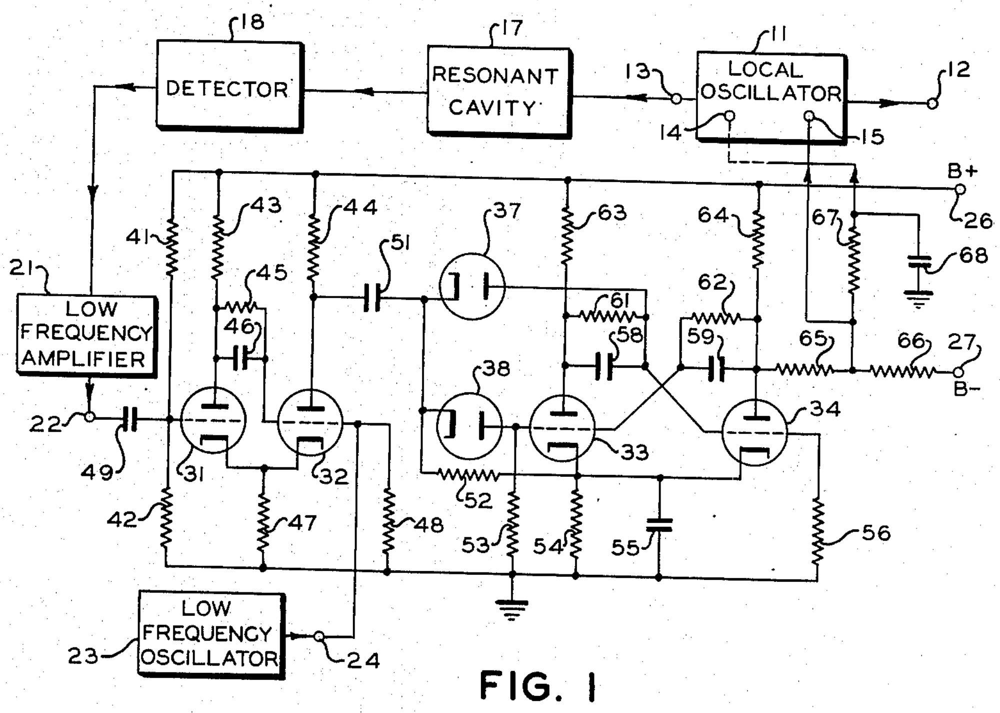
Fig. 1 is a schematic diagram of one form of the invention.
Figure 2:
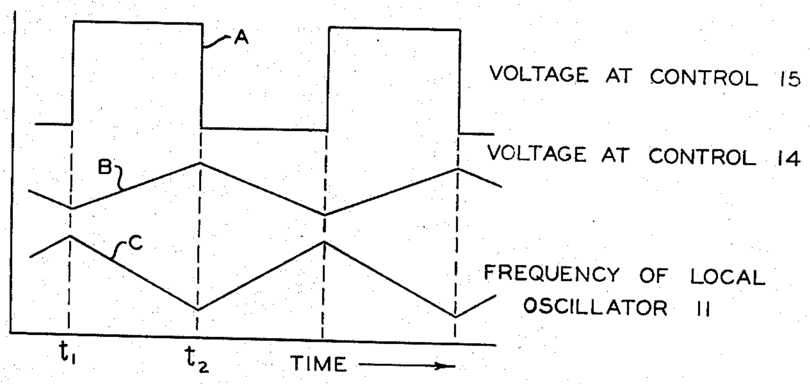
Fig. 2 depicts graphs useful in explaining the invention.

Referring to the drawing, and more particularly to Fig. 1, an automatic tuning control system is shown having a local oscillator 11, a resonant cavity 17, a detector 18, a low frequency amplifier 21, a low frequency oscillator 23, a multivibrator (electron tubes 31 and 32), and a modified Eccles-Jordan multivibrator or scale-of-two circuit (electron tubes 33 and 34) which controls the frequency of local oscillator 11 by either or both of the voltages shown as curves A and B of Fig. 2.

Local oscillator 11 has its output split; one fraction thereof appearing at terminal 12 is available for use in a mixer (not shown) or other load, the other fraction appearing at terminal 13 is applied to resonant cavity 17. Local oscillator 11 is shown as having a frequency control electrode 14 (such as the repeller of a reflex klystron) and a thermal tuning control 15 for mechanically controlling the frequency. Any type of oscillator may be used with the present control system providing it has either a frequency control electrode having immediate response, or a means for converting a frequency control voltage, such as that of curve A (Fig. 2), to mechanical tuning of the oscillator.

Resonant cavity 17 is a high Q circuit for use as a frequency selective device at very high frequencies such as those encountered in radar. Resonant cavity 17 has a sharp frequency response curve at a predetermined frequency and is used in the control system of this invention to maintain the local oscillator 11 at this frequency. In one embodiment of this invention resonant cavity 17 may be pretuned so as to enable reception from a fixed frequency beacon whose frequency differs from that of a cavity 17 by the intermediate frequency of the receiver. Although the frequency selective device 17 has been disclosed as a resonant cavity it is to be understood that a lumped constant circuit having the desired frequency response could be used. It is also to be understood that its input may be the intermediate frequency, this invention then controlling the local oscillator so as to maintain this intermediate frequency constant.

This invention causes local oscillator 11 to shift back and forth in frequency (curve C of Fig. 2) about the resonance peak of resonant cavity 17. As the frequency changes about this resonance peak the output of cavity 17 will be essentially sine wave modulated due to the response characteristics of cavity 17. Detector 18 obtains the envelope of this since wave modulation which is at a low frequency, namely the frequency at which the local oscillator sweeps about the cavity resonance peak. This modulation envelope at the output of detector 18 is amplified by an audio or low frequency amplifier 21. Amplifier 21 has sufficient gain so that its output voltage at terminal 22 will trigger the following multivibrator. As the gain of amplifier 21 is increased the aforementioned frequency shift of local oscillator 11 will be decreased in amplitude or range. Amplifier 21 has good response at very low frequencies. The polarity of the voltage output of amplifier 21 is such that it decreases from a positive maximum as the frequency of oscillator 11 shifts away from the resonance peak of cavity 17.

This voltage output at terminal 22 is applied through coupling condenser 49 to the grid of electron tube 31 to trigger a cathode coupled multivibrator comprising electron tubes 31 and 32, common cathode coupling resistor 47, grid resistors 42 and 48, plate resistors 43 and 44, and a coupling network of resistor 45 and condenser 46 in parallel between the plate of tube 31 and the grid of tube 32. Resistors 41 and 42 comprise a voltage divider to ground from a positive potential applied at terminal 26 to set the bias for tube 31 so that it will be the normally conductive tube of the multivibrator. Resistors 41 and 42 also affect D.-C. restoration of the voltage wave from terminal 22 so that it need go only slightly in a negative direction to cause tube 32 to start conducting and by multivibrator action, cause tube 31 to cut off. As tube 32 starts to conduct its plate voltage will drop quite rapidly. This negative voltage wave is coupled through condenser 51 and diode 37 or 38 to trigger the Eccles-Jordan multivibrator. The above action takes place at a time such as $t_1$ (Fig. 2) and causes the direction of tuning to reverse so that the voltage at terminal 22 starts going in a positive direction as the frequency of oscillator 11 approaches the resonance peak of cavity 17. This positive voltage causes electron tube 31 to start conducting again and cuts off tube 32 causing its plate voltage to rise. However, this positive voltage wave cannot be coupled through diodes 37 and 38 and therefore will not trigger the Eccles-Jordan multivibrator. Thus the direction of tuning of oscillator 11 does not change but continues on through the resonance peak of cavity 11. As the frequency shifts away from the resonance peak on the opposite side the voltage at terminal 22 again goes in a negative direction and at time $t_2$ again causes tube 32 to conduct thus supplying another negative voltage wave which can be coupled through diode 37 or 38 to again trigger the Eccles-Jordan multivibrator.

The aforementioned modified Eccles-Jordan multivibrator comprises electron tubes 33 and 34, a cathode biasing circuit of resistor 54 and condenser 55 in parallel, grid resistors 53 and 56, plate resistors 63 and 64, and coupling networks having resistor 61 and condenser 58 in parallel and resistor 62 and condenser 59 in parallel. An Eccles-Jordan multivibrator has two stable conditions. In one condition one tube (such as tube 33 during the interval from $t_1$ to $t_2$) is conducting and the other is cut off, and in the other condition the first tube (tube 33 after $t_2$) is cut off and the second tube is conducting. The aforementioned negative voltage wave from the plate of tube 32 is coupled through condenser 51 and diode 37 to the grid of tube 34, and through diode 38 to the grid of tube 33. Thus, at time $t_1$, this negative voltage wave will have no effect on tube 33 since it is already cut off but it will cause tube 34 to reduce its conduction and by multivibrator action bring tube 33 into full conduction. Likewise at time $t_2$ tube 33 will be cut off and tube 34 will come into full conduction. The above action produces at the plate of tube 34 a rectangular voltage wave similar in shape to curve A of Fig. 2.

A voltage divider comprising resistors 65 and 66 is connected from the plate of tube 34 to a negative potential applied at terminal 27. The output voltage for thermal control 15 of local oscillator 11 is obtained at the junction of resistors 65 and 66. The voltage at the junction of resistors 65 and 66 is also passed through a long time constant RC filter comprising a series resistor 67 and shunt condenser 68. The output voltage from this filter is shown as curve B of Fig. 2 and is available for use at frequency control electrode 14 of oscillator 11 (as shown by dotted line of Fig. 1). The time constant of the above filter should be such that voltage wave B applied to control 14 produces changes of frequency comparable to those produced by the application of voltage wave A to control 15. The size of resistors 64, 65 and 66 are so chosen that the frequency control voltage waves (curves A and B of Fig. 2) are at all times negative by an amount necessary for frequency controls 14 and/or 15 of local oscillator 11.

It is conceivable that local oscillator 11 might start or inadvertently drift off to the end of its tuning range so that no further triggering action of the aforementioned first multivibrator would take place. In such a case local oscillator 11 would be at an undesired frequency and would receive no control voltage to cause it to shift its frequency toward the resonance peak of cavity 17. To overcome this difficulty a "poker" circuit comprising a low frequency oscillator 23 is provided to cause oscillator 11 to shift frequency and "hunt" for the resonant frequency of cavity 17. With no input trigger (as mentioned above) the first multivibrator will revert to and remain in the condition where tube 31 is conductive and tube 32 is not. Thus the Eccles-Jordan multivibrator will not be triggered. By connecting the output terminal 24 to the grid of tube 32 the positive cycle of the output voltage from low frequency oscillator 23 will bring tube 32 into conduction and produce a negative voltage wave at its plate. This negative voltage wave in turn triggers the Eccles-Jordan multivibrator changing the control voltages A and B and causing the frequency of local oscillator 11 to change or shift. This frequency will continue to shift until it passes through the resonance peak of cavity 17 when the above described normal circuit action again takes place. The frequency of oscillator 23 must be low enough so that its period is equal to or greater than the time necessary for control voltage A and/or B to cause local oscillator 11 to tune through its entire operating frequency range. This length of period is necessary so that the frequency shift is not reversed in the hunting process before the resonant frequency of cavity 17 is reached. In normal action of the invention tube 32 is rarely triggered by the voltage from low frequency oscillator 23. However if it is triggered by this voltage the normal functioning of the other circuits will return local oscillator 11 to the desired frequency.

The curves of Fig. 2 depict circuit action of local oscillator 11 near the resonant frequency of cavity 17. Curves A and B are graphs of negative voltage plotted against time and curve C is a graph of frequency plotted against time.

In one test of the invention it was found that the voltage at terminal 22 had a frequency of approximately 30 cycles per second and that local oscillator 11 shifted frequency one megacycle about a desired super high frequency. It was also found that the time for oscillator 11 to tune through its entire range was one to seven seconds and was dependent upon the type of tube used. Therefore low frequency oscillator 23 was made to operate at a frequency of a fraction of a cycle per second.

The control system of this invention works equally well with the local oscillator frequency above or below the frequency of the signal to be received, and it causes the local oscillator to hunt for the correct frequency. The power output of the local oscillator is at a maximum.

The invention described in the foregoing specification need not be limited to the details shown, which are considered to be illustrative of one form the invention may take.

What is claimed is:

1. In an electrical control system, an oscillator having a frequency control element, a reference frequency selective device, means for sweeping the frequency of said oscillator about the resonant frequency of said frequency selective device comprising, means for coupling the output of said oscillator to said frequency selective device, a detector energized by the output of said frequency selective device, a multivibrator circuit triggered when said detector output is a predetermined value, said multivibrator providing an output signal to a dual stable condition multivibrator circuit through a diode rectifier, said dual stable condition multivibrator circuit when energized through said diode rectifier providing a signal to said oscillator frequency control element to reverse the direction of frequency sweep of said oscillator, and a low frequency oscillator providing a periodic triggering signal to said multivibrator, said last mentioned triggering signal being at a frequency less than the triggering frequency of said multivibrator circuit.

2. In an electrical control system, an oscillator having a frequency control element, a reference frequency selective device, means for sweeping the frequency of said oscillator about the resonant frequency of said frequency selective device comprising, means for coupling the output of said oscillator to said frequency selective device, a detector energized by the output of said frequency selective device, and a switching circuit energized by the output of said detector, said switching circuit including a first and second multivibrator, the output of said first multivibrator being connected to said second multivibrator through a unidirectional coupling device, said switching circuit when energized changing the direction of frequency sweep of said oscillator.

3. In an electrical control system, an oscillator having a frequency control element, a reference frequency selective device, means for sweeping the frequency of said oscillator about the resonant frequency of said frequency selective device comprising, means for coupling the output of said oscillator to said frequency selective device, a detector energized by the output of said frequency selective device, and a switching circuit energized by the output of said detector, said switching circuit including a multivibrator and a dual stable condition multivibrator crcuit, the output of said multivibrator being coupled through a diode circuit to said dual stable condition multivibrator circuit, the output of said dual stable condition multivibrator circuit being coupled to said oscillator frequency control element, said switching circuit when energized changing the direction of frequency sweep of said oscillator.

References Cited in the file of this patent

UNITED STATES PATENTS

| Number | Name | Date |
|---|---|---|
| 2,434,294 | Ginzton | Jan. 13, 1948 |
| 2,475,074 | Bradley et al. | July 5, 1949 |

FOREIGN PATENTS

| Number | Country | Date |
|---|---|---|
| 445,350 | Great Britain | Apr. 6, 1936 |